(12) United States Patent
Miller et al.

(10) Patent No.: US 10,684,547 B2
(45) Date of Patent: Jun. 16, 2020

(54) DEVICES AND METHODS FOR NON-PLANAR PHOTOLITHOGRAPHY OF NAIL POLISH

(71) Applicant: L'Oréal, Paris (FR)

(72) Inventors: Zane Bowman Allen Miller, Seattle, WA (US); Vincenzo Casasanta, III, Woodinville, WA (US)

(73) Assignee: L'Oréal, Paris (FR)

( * ) Notice: Subject to any disclaimer, the term of this patent is extended or adjusted under 35 U.S.C. 154(b) by 389 days.

(21) Appl. No.: 15/402,681

(22) Filed: Jan. 10, 2017

(65) Prior Publication Data

US 2018/0196342 A1    Jul. 12, 2018

(51) Int. Cl.
*G03F 7/24* (2006.01)
*G03F 7/20* (2006.01)

(52) U.S. Cl.
CPC .............. *G03F 7/24* (2013.01); *G03F 7/2057* (2013.01)

(58) Field of Classification Search
CPC .... A45D 29/00; A45D 2029/005; G03F 7/24; G03F 7/2057
See application file for complete search history.

(56) References Cited

U.S. PATENT DOCUMENTS

| | | | | |
|---|---|---|---|---|
| 4,704,303 A | * | 11/1987 | Cornell | A45D 31/00 424/61 |
| 5,985,951 A | | 11/1999 | Cook | |
| 7,239,370 B2 | * | 7/2007 | Jansen | G03F 7/70308 250/492.22 |
| 8,399,537 B2 | | 3/2013 | Conger et al. | |
| 8,901,199 B2 | | 12/2014 | Vu et al. | |
| 2001/0042068 A1 | * | 11/2001 | Yoshida | G05B 19/401 |
| 2006/0002875 A1 | | 1/2006 | Winkler | |
| 2008/0253980 A1 | | 10/2008 | Weber et al. | |
| 2010/0040741 A1 | | 2/2010 | Butler et al. | |
| 2010/0167189 A1 | * | 7/2010 | Del Puerto | G03B 27/68 430/30 |
| 2011/0265809 A1 | | 11/2011 | Jeon | |
| 2012/0236278 A1 | * | 9/2012 | Kwon | G03F 7/2057 355/53 |

(Continued)

FOREIGN PATENT DOCUMENTS

| | | | | |
|---|---|---|---|---|
| JP | 2006312596 | * | 11/2006 | ............... A61K 8/00 |
| KR | 20100087425 A | | 8/2010 | |

(Continued)

OTHER PUBLICATIONS

English Translation of JP2006312596-Abstract, Kawamoto, "Nail Polish for use as cosmetic, contains photoresist and coating film releasing agent in organic solvent system". (Year: 2006).*

(Continued)

*Primary Examiner* — Daborah Chacko-Davis
(74) *Attorney, Agent, or Firm* — Christensen O'Connor Johnson Kindness PLLC

(57) ABSTRACT

Systems and methods for patterning nail polish are disclosed. In one embodiment, the system includes a source of light, and a programmable mask that can selectively transmit light to a photoresist nail polish. In some embodiments, the programmable mask is a liquid crystal display (LCD) or a digital light processing screen (DLP). The system may also include a controller configured for controlling the light transmission properties of the programmable mask.

16 Claims, 5 Drawing Sheets

(56) References Cited

U.S. PATENT DOCUMENTS

| | | | |
|---|---|---|---|
| 2014/0323323 A1 | 10/2014 | Cunningham et al. | |
| 2015/0158911 A1 | 6/2015 | Parker et al. | |
| 2015/0329604 A1 | 11/2015 | Parker et al. | |
| 2016/0227900 A1* | 8/2016 | Kumagai | ............... A45D 31/00 |

FOREIGN PATENT DOCUMENTS

| | | | |
|---|---|---|---|
| KR | 20120118215 A | 10/2012 | |
| WO | 2005/011991 A1 | 2/2005 | |
| WO | 2011/141878 A1 | 11/2011 | |

OTHER PUBLICATIONS

Parnell et al, "Continuously Tuneable Optical Filters from Self-Assembled Block Copolymer Blends", Journal, Soft Matter, 2011, pp. 3721-3725, (7), The Royal Society of Chemistry.

Dumé, "Photonic Gyroids Mimic Butterfly Wings", Article, May 13, 2016, 3 pages, nanotechweb.org/cws/article/tech/64982.

Zhu et al., "Flexible Photonic Metastructures for Tunable Coloration", Letter, Optica, Mar. 2015, pp. 255-258, vol. 2(3), Optical Society of America.

International Search Report and Written Opinion of the International Searching Authority dated Apr. 5, 2018 in corresponding International Application No. PCT/US2017/067720, filed Dec. 20, 2017, 19 pages.

NailPro Magazine, "Flow to Master Nail Stamping" <https://www.nailpro.corn/stamping-tips>; Dec. 31, 2015 (Year: 2015).

\* cited by examiner

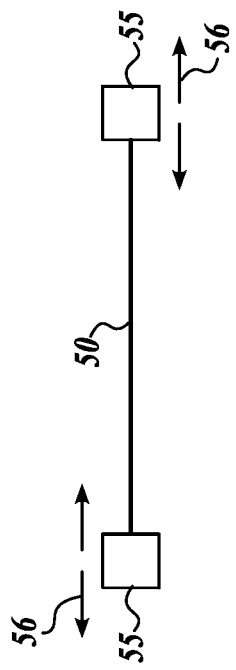
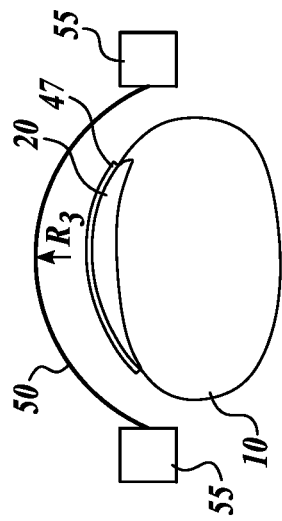
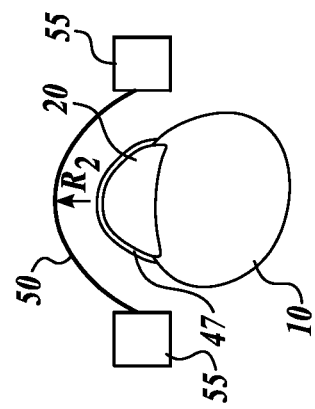
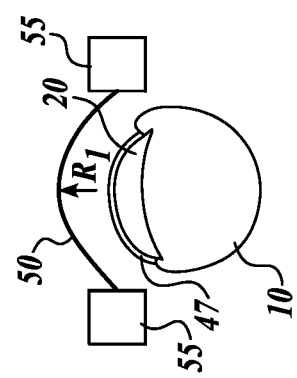
Fig. 2.
Fig. 2A.
Fig. 2B.
Fig. 2C.

US 10,684,547 B2

DEVICES AND METHODS FOR NON-PLANAR PHOTOLITHOGRAPHY OF NAIL POLISH

SUMMARY

In an aspect, the present disclosure features a nail polish system, including a source of light, a programmable mask to selectively transmitting light to a photoresist nail polish, and the photoresist nail polish. In another aspect, the present disclosure features the programmable mask that is a liquid crystal display (LCD) or a digital light processing screen (DLP). In yet another aspect, the present disclosure features a nail polish system, including a light assembly having circuitry for delivering an optical stimulus onto a photoresist nail polish, and a programmable mask for selectively permitting passage of a portion of the optical stimulus onto the photoresist nail polish, where the programmable mask can generate one or more spaced-apart patterns of a dimension and character to form a plurality of photonic nanostructures within the photoresist nail polish.

In another aspect, the present disclosure features a method for patterning a photoresist nail polish, including emitting a light by a source of light, at least partially transmitting the light through a programmable mask, changing a transmissivity/reflectivity of the programmable mask by a controller that changes states of individual pixels of the programmable mask, and illuminating the photoresist nail polish with the transmitted light. The summary above is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of this disclosure will become more readily appreciated as the same become better understood by reference to the following detailed description, when taken in conjunction with the accompanying drawings, wherein:

FIG. 2 is a schematic illustration of an actuating system in accordance with an embodiment of the present technology.

FIGS. 2A-2C are schematic illustrations of shaping of a programmable mask in accordance with an embodiment of the present technology.

DETAILED DESCRIPTION

The following disclosure describes various embodiments of systems and associated methods for nail polish patterning. A person skilled in the relevant art will also understand that the technology may have additional embodiments, and that the technology may be practiced without several of the details of the embodiments described below with reference to FIGS. 1-5.

Briefly described, systems and methods for applying patterns on nail varnish are described herein. In some embodiments, a photoresist nail polish (also referred to as nail polish, nail varnish, photoresist, or photopolymer) is illuminated through a programmable mask. In some embodiments, the programmable mask is a liquid crystal display (LCD) or a digital light processing (DLP) screen having its transmittance and/or reflectivity controlled by a controller or a computer. After the photoresist nail polish is illuminated by a source of light (e.g., a laser, LED array, or other source of light/optical stimulus), the illuminated portion of the nail polish may begin a chemical reaction (e.g., polymerization). The unreacted portion of the photoresist nail polish can be removed with solvents, leaving a decorative pattern on the nail. In some embodiments, the process can be repeated by applying another layer of the photoresist nail polish, and repeating the illumination/removal process for the photoresist nail polish. In some embodiments, a distance between the nail and the programmable mask is measured to better focus the light.

In some embodiments, patterned nail polishes are used in conjunction with nail polishes that include photonic particles and/or block copolymers that can self-assemble to provide a structurally colored coating. Such nail polishes (nail varnishes) are described, for example, in a patent application titled Dye-Free Nail Varnish Compositions and Methods Thereof, U.S. patent application Ser. No. 15/403,051 (now U.S. Pat. No. 10,362,850), filed concurrently with this application, and incorporated herein by reference in its entirety. Nail polishes are also described in U.S. Pat. Nos. 5,985,951, 8,399,537 and 8,901,199.

Thus, the present disclosure features a photoresist nail polish, a programmable mask and a source of light that produce patterned or variably shaded nail polish.

Figure 1:
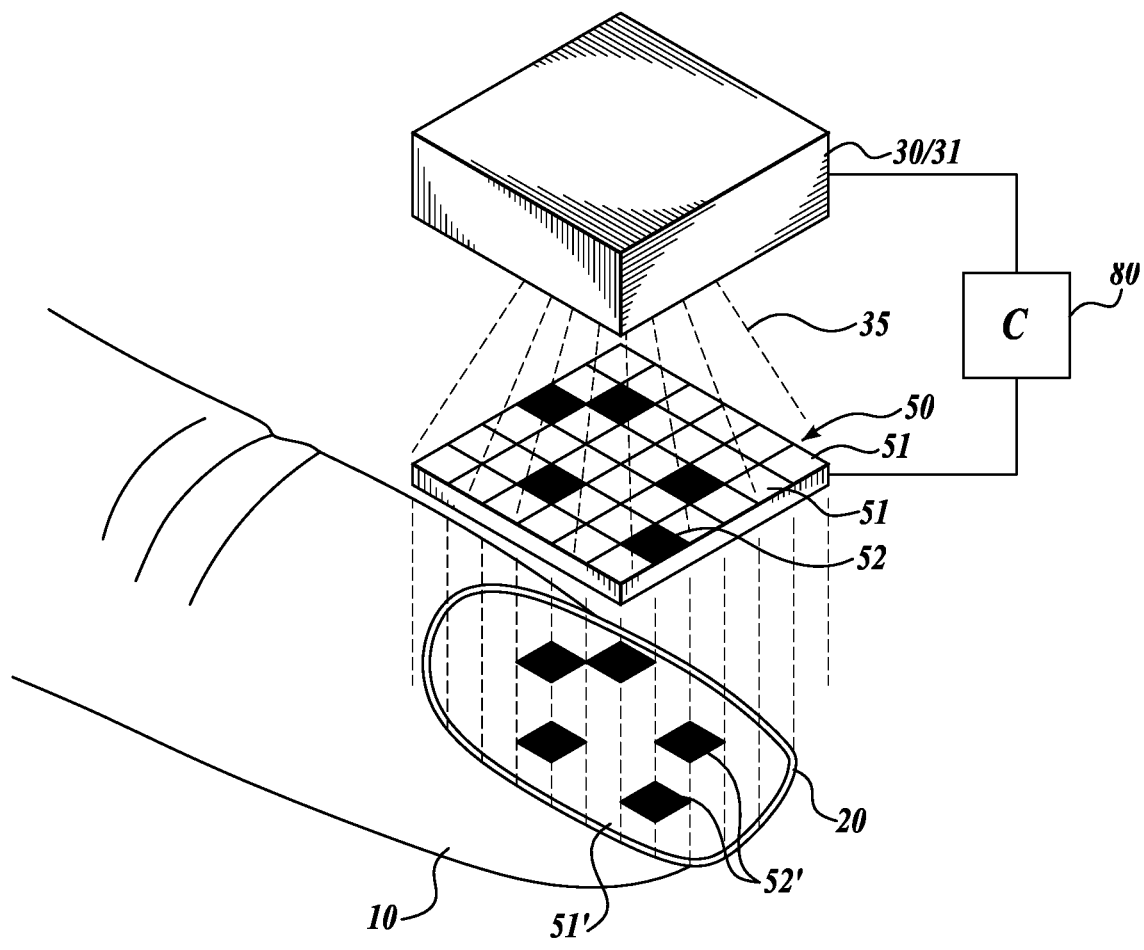
FIG. 1 is a partially schematic isometric view of a photolithography system in accordance with an embodiment of the present technology.

FIG. 1 is a partially schematic isometric view of a photolithography system in accordance with an embodiment of the present technology. In an embodiment, a photoresist nail polish (also referred to as nail varnish, nail polish, or photopolymer) 47 is spread over a nail 20 on a finger 10.

In an embodiment, a source of light 30 is positioned over a programmable mask 50. Depending on the state of individual pixels 51/52 of the programmable mask 50 (e.g., transmitting pixels 51, non-transmitting pixels 52, collectively, patterns or spaced-apart patterns), light 35 from the source of light 30 is transmitted-to or blocked-from the nail polish 47. As a result, the photoresist nail polish 47 is selectively illuminated by light 35 to start a light-induced reaction in the photoresist nail polish 47. In some embodiments, such light-induced reaction changes the properties of the nail polish (e.g., a photopolymer) in an illuminated area 51'. For example, the illuminated area 51' may become less removable by solvents off the nail 20 than the non-illuminated area 52', because the cross-polymerization is initiated in the illuminate area 51'. In other embodiments, depending on particular combinations of light wavelength and the material of the photoresist nail polish 47, the reverse may be true, that is, the illuminated area 51' may be less removable by solvents than the non-illuminated area 52'.

In some embodiments, the programmable mask 50 is an LCD having pixels in rows and columns. Some examples of the programmable mask 50 are 32128A FC BW-3 available from Displaytech LTD, EA DOGS102W-6 available from Electronic Assembly, and NHD-240128WG-BTFH-VZ available from Newhaven Displays. The pixels 51/52 can be turned into their transmitting/reflecting (or transparent/non-transparent, or transmitting/blocking) state by a controller 80 based on tables, graphs, or other input data that describe the desired pattern. Furthermore, "transmitting" and "blocking" light can include completely or partially transmitting or blocking the light through the programmable mask 50. In some embodiments, a patterned foil can be used in place or in conjunction with the programmable mask 50. For example, a transparent foil can be painted to selectively transmit/block light to the photoresist nail polish 47.

Several cycles of the illumination and nail polish removal may be implemented to achieve a desired pattern. In some embodiments, differing overlapping patterns are applied successively. In the context of the inventive technology, the illuminated area 51' and non-illuminated area 52' may include partial illumination of the surface of the nail polish 47.

The light 35 may be in the visible or invisible (e.g., ultraviolet) spectrum. Some examples of the source of light 30 are a laser, an array of light emitting diodes doped to produce light at the curing wavelength, or a Wood's lamp or similar light source with a bandpass filter. In some embodiments, the source of light 30 includes lenses.

In some embodiments, distance from the nail 20 to the programmable mask 50 is measured by a distance detector 31. Some examples of the distance detector 31 are infrared range finders and light detection and ranging (LIDAR) devices. In some embodiments, the distance detector 31 operates by emitting a constant, predetermined pattern of infrared dots to a target nail. A monochrome CMOS sensor may be placed at an offset relative to the IR emitter, and the difference between the observed and expected IR dot positions is used to calculate the true location of the infrared dots at the target nail.

In some embodiments, the pattern of infrared dots corresponds to a 2D array. Comparison between the observed distribution of the infrared dots (i.e., as deformed over a 3D surface of the nail) and the corresponding theoretical distribution (i.e., infrared dots distributed over a 2D plane that is perpendicular to the source) can be used to determine the 3D surface of the nail. In some embodiments, the infrared dots are invisible to human eye. In some embodiments, based on the distance from the programmable mask 50 to the nail 20, the output of the source of light 30 is adjustable by the controller 80.

Some examples of suitable photoresist nail polish 47 are listed below. In some embodiment, the photoresist nail polish is composed of methacrylate monomers, methacrylate oligomers and photoinitiators.

Some examples of suitable monomers are listed below. For example, the (meth)acrylate monomer may be chosen from (meth)acrylate monomers, such as methyl (meth)acrylate (MMA), ethyl (meth)acrylate (EMA), butyl (meth)acrylate (BMA), and polyethylene monomethacrylate such as diethylene glycol monomethacrylate, polypropylene glycol monomethacrylate such as dipropylene glycol monomethacrylate, and isobornyl (meth)acrylate, and tetrahydrofurfuryl (meth)acrylate (THFMA), and hydroxyalkyl (meth)acrylate monomers, such as hydroxypropyl methacrylate (HPMA), hydroxyethyl (meth)acrylate (HEMA), and butoxyethyl (meth)acrylate (BEMA). An example of commercially available monomer is tetrahydrofurfuryl methacrylate (THFMA) available from Esstech, Inc. (X-958-7466). Preferably, the (meth)acrylate monomer is present in the composition of the invention in the amount from about 0.01% to about 60% by weight, typically from about 10% to about 45% by weight, more particularly from about 20% to about 40% by weight, including all ranges and subranges there between, all weights being based on the total weight of the composition.

Some examples of suitable oligomers which are Urethane (meth)acrylate compounds.

Some examples of suitable photoinitiators include, but are not limited to, alpha-hydroxyketones, marketed for example under the names DAROCUR® 1173 and 4265, IRGACURE® 184, 2959, and 500 by BASF, and ADDITOL® CPK by CYTEC, alpha.-aminoketones, marketed for example under the names IRGACURE® 907 and 369 by BASF, aromatic ketones marketed for example under the name ESACURE® TZT by LAMBERTI, thioxanthones marketed for example under the name ESACURE® ITX by LAMBERTI, and quinones (these aromatic ketones generally require the presence of a hydrogen donor compound such as tertiary amines and particularly alkanolamines, for example, the tertiary amine ESACURE® EDB marketed by LAMBERTI), alpha-dicarbonyl derivatives of which the most common is benzyl dimethyl ketal marketed under the name IRGACURE® 651 by BASF, and acylphosphine oxides, such as for example bis-acylphosphine oxides (BAPO) marketed for example under the names IRGACURE® 819, 1700, and 1800, DAROCUR® 4265, LUCIRIN® TPO, and LUCIRIN® TPO-L by BASF. Preferably, the photoinitiator is selected from the group consisting of alpha-hydroxyketones, alpha-aminoketones, aromatic ketones preferably associated with a hydrogen donor compound, aromatic alpha-diketones, acylphosphine oxides, and mixtures thereof. Preferably, the at least one photoinitiator is present in the nail composition of the present invention in amounts of active material generally ranging from about 0.1% to about 10%, preferably from about 1% to about 7%, and more preferably from about 2.5% to about 5%, by weight, based on the total weight of the cosmetic composition, including all ranges and subranges in between.

In some embodiment, the photoresist nail polish 47 includes a plurality of photonic particles and/or a block copolymer, which can self-organize to form patterns of photonic nanostructures that provide a structurally colored photoresist nail polish under incident white light. In another embodiment, the coating of the photoresist nail polish includes a pattern including a plurality of photonic particles, a block copolymer, or both a plurality of photonic particles and a block copolymer. The coating of photoresist nail polish may include a surface pattern of photonic nanostructures (e.g., imprinted by the stamp or developed through the application of the systems and methods described below) that together provide the photoresist nail polish coating having one or more structural colors under incident white light.

FIG. 2 is a schematic illustration of an actuating system in accordance with an embodiment of the present technology. In some embodiments, the programmable mask 50 is held by one or more actuators 55 (e.g., solenoids, manually actuated linear bearings, a combination of a linear bearing and a rotational joint, etc.). When the programmable mask 50 is sufficiently flexible, the actuators 55 can shape the mask for, e.g., better focusing of light 30 over the photoresist nail polish 47. Some examples of shaping the programmable mask 50 are described below with reference to FIGS. 2A-2C.

FIGS. 2A-2C are schematic illustrations of shaping of a programmable mask in accordance with an embodiment of the present technology. In some embodiments, the programmable mask 50 is shaped by the actuators 55 to correspond to or at least to approximate shape of the nail 20. For example, the programmable mask 50 may be bent to approximate radiuses R1, R2, R3 of the illustrated nails 20. In other embodiments, the programmable mask 50 is bent to other shapes that, for example, promote better focusing of the light over the photoresist nail polish 47.

Figure 3:
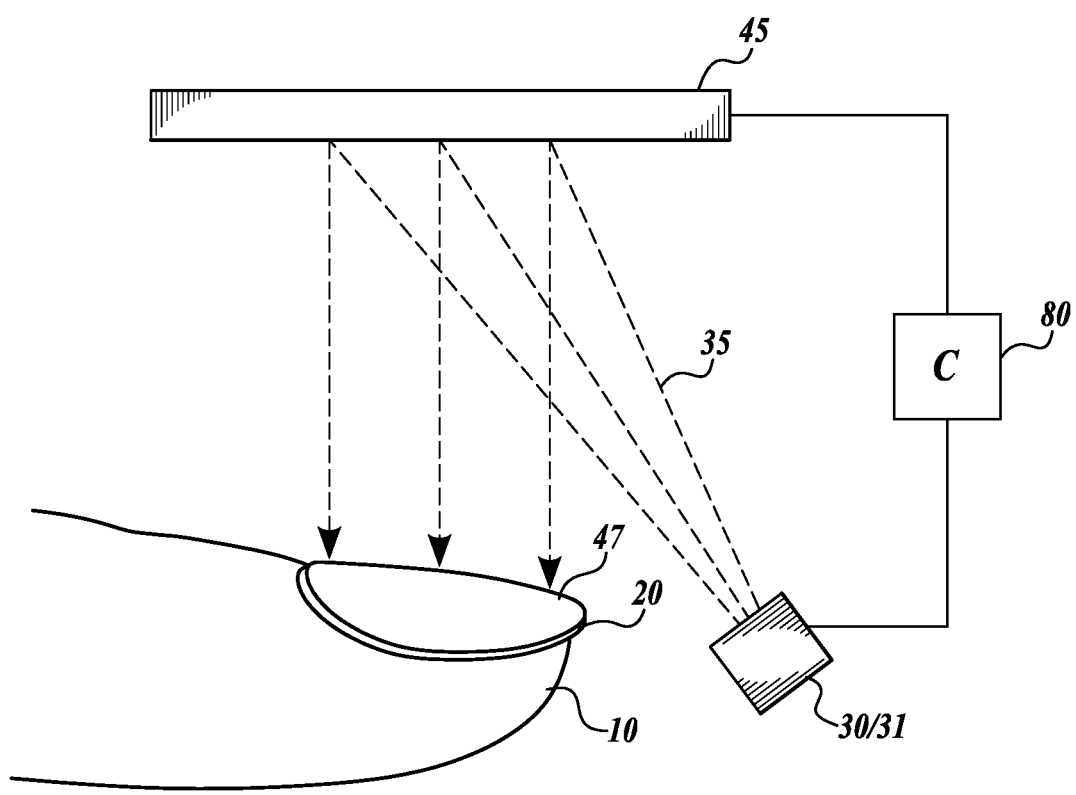
FIG. 3 is a partially schematic view of a photolithography system in accordance with an embodiment of the present technology.

FIG. 3 is a partially schematic view of a photolithography system in accordance with an embodiment of the present technology. The source of light 30 emits light 35 at a programmable mask 45. In some embodiments, the programmable mask 45 is configured to reflect light 35 toward the photoresist nail polish 47 that covers nail 40. In some embodiments, the programmable mask 45 may be a digital light processing (DLP) screen having a controllable reflectivity. For example, the programmable mask 45 can include a 2D array of micro-electro-mechanical (MEMS) mirrors controlled by a controller 80.

In some embodiments, the distance detector 31 measures distance between the programmable mask 45 and the photoresist nail polish 47, and provides distance information to the controller 80. In response, the controller 80 sends control signal to the programmable mask 50 (e.g., to the MEMS mirrors to adjust the mirror angles) to adjust targeting of light 35 to the photoresist nail polish 47.

Figure 4:
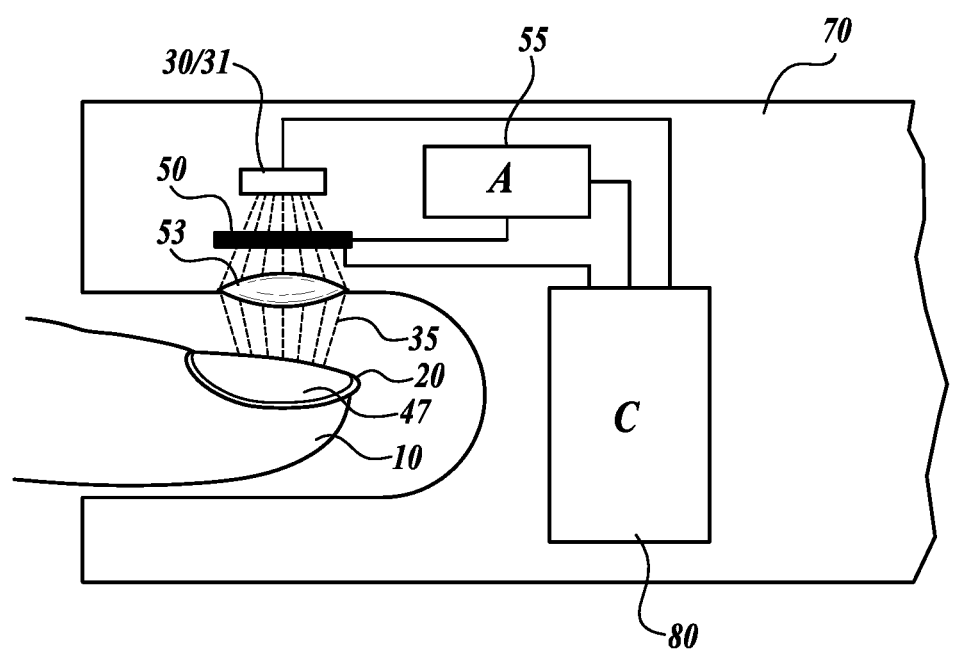
FIG. 4 is a cross-sectional schematic view of a photolithography system in accordance with an embodiment of the present technology.

FIG. 4 is a cross-sectional schematic view of a photolithography system in accordance with an embodiment of the present technology. In some embodiments, a housing 70 improves positioning of the finger 10 with respect to light 35. For example, focusing of light 35 over the photoresist nail polish 47 may be improved. The housing 70 may carry the source of light 30, distance detector 31, actuator 55, and/or programmable mask 50. The controller 80 may control the source of light 30 and/or programmable mask 50 to, for example, improve patterning or focusing of light 35.

In some embodiments, a lens 53 focuses light over the photoresist nail polish 47 for improved focus and patterning. In some embodiments, a distance between the programmable mask 50 and the photoresist nail polish 47 is measured with the distance detector 31.

Figure 5:
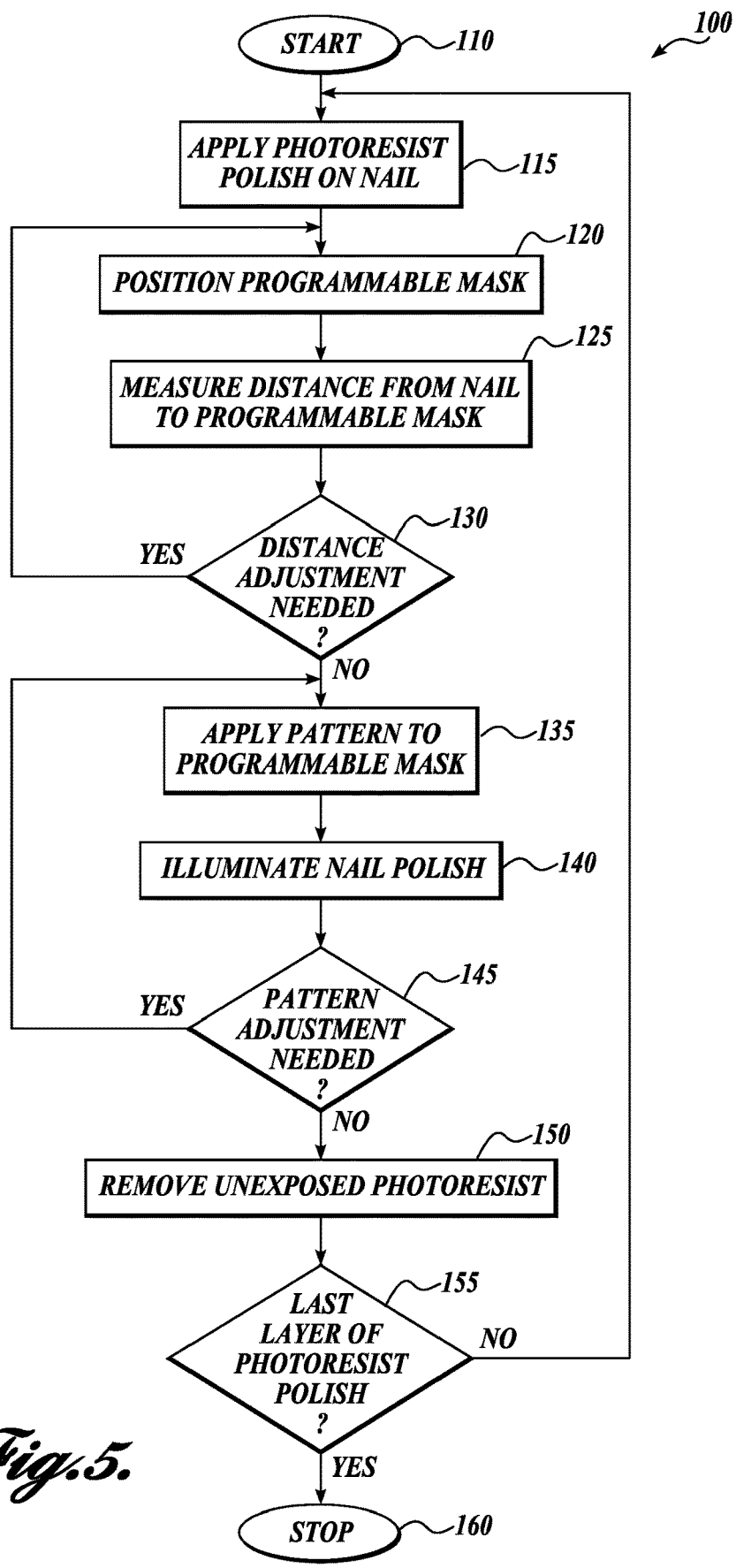
FIG. 5 is a flow diagram of a method in accordance with embodiments of the present technology.

FIG. 5 is a flow diagram of a method 100 in accordance with embodiments of the present technology. In some embodiments, additional steps can be included in the method. In some embodiments, the method can be executed without all the steps shown in the flow diagram.

The method can start in step 110. In step 115, the photoresist nail polish 47 is applied over the nail. In step 120, the programmable mask (e.g., LCD 50 or DLP 45) can be positioned with respect to the nail. In step 125, the distance detector 31 may measure distance from the nail to the programmable mask. In step 30, the measured distance can be compared with a target value, and a decision is made whether further distance adjustments are needed. In some embodiments, this decision is made by the controller. If the adjustments are needed (e.g., an adjustment of the distance from the programmable mask to the nail or an adjustment of a curvature of the programmable mask), the method goes back to step 120. If no adjustments are needed, the method proceeds to step 135.

In step 135, a pattern is applied the programmable mask by, for example, the controller. In step 140, the photoresist nail polish is illuminated by the source of light. In step 145, a decision is made about adjusting the pattern. For example, the pattern may be repeated for additional exposure time, another pattern may be applied, the existing pattern may be shifted in space, and so on. In some embodiments, the decision is made by the controller. If the pattern adjustment is needed, the method goes back to step 135. For example, the pixels in the programmable mask may be adjusted to produce a new pattern. If no adjustment is needed, the method proceeds to step 155.

In step 155, the method verifies if the last layer of the photoresist nail polish has been applied. If another layer needs to be applied, the method proceeds to step 115. If the last layer of the photoresist has been applied, the method ends at step 160.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, controller or data processor that is specifically programmed, configured or constructed to perform one or more of the computer-executable instructions described above. Accordingly, the terms "computer" and "controller" as generally used herein refer to any data processor and can include Internet appliances and hand-held devices (including palm-top computers, wearable computers, cellular or mobile phones, multi-processor systems, processor-based or programmable consumer electronics, network computers, mini computers and the like).

From the foregoing, it will be appreciated that specific embodiments of the technology have been described herein for purposes of illustration, but that various modifications may be made without deviating from the disclosure. For example, in some embodiments, the DLP can be DLP3000FQB from Texas Instruments. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure can encompass other embodiments not expressly shown or described herein.

The embodiments of the disclosure in which an exclusive property or privilege is claimed are defined as follows:

1. A nail polish system, comprising:
a housing having an opening configured to receive a fingernail of a finger, the housing containing:
a source of light;
a programmable mask configured to selectively transmit or reflect light from the source of light to a photoresist nail polish on the fingernail, the programmable mask having a variable curvature; and
an actuator configured to bend the programmable mask such that the variable curvature of the programmable mask approximates a curvature of the fingernail received within the opening of the housing and underneath the programmable mask.

2. The nail polish system of claim 1, further comprising the photoresist nail polish.

3. The nail polish system of claim 1, wherein the programmable mask is a liquid crystal display (LCD) or a digital light processing screen (DLP).

4. The nail polish system of claim 3, further comprising a controller configured to control light transmission properties of the programmable mask.

5. The nail polish system of claim 3, further comprising a lens configured to focus light onto the photoresist nail polish.

6. The nail polish system of claim 1, wherein the programmable mask is a patterned foil.

7. The nail polish system of claim 1, further comprising:
a controller; and
a distance detector configured to measure a distance between the programmable mask and the photoresist nail polish on the fingernail received within the opening of the housing, and to provide the distance to the controller,
wherein the controller causes the actuator to bend the programmable mask based upon the distance between the programmable mask and the photoresist nail polish.

8. The nail polish system of claim 7, wherein the distance detector is an infrared range finder or a light detection and ranging (LIDAR) device.

9. The nail polish system of claim 1, further comprising:
a lens contained within the housing and configured to focus light onto the photoresist nail polish.

10. The nail polish system of claim 1,
wherein the actuator is a first actuator,
the nail polish system further comprising a second actuator connected to a different side of the programmable mask from the first actuator, the second actuator being configured to bend the programmable mask along with the first actuator such that the variable radius approximates the curvature of the fingernail received within the opening of the housing and underneath the programmable mask.

11. A nail polish system, comprising:
a housing having an opening configured to receive a fingernail of a finger, the housing containing:
 a light assembly including circuitry configured to deliver an optical stimulus onto a photoresist nail polish on the fingernail;
 a programmable mask configurable to selectively permit passage of a portion of the optical stimulus onto the photoresist nail polish, the programmable mask configured to generate one or more spaced-apart patterns of a dimension and character to form a plurality of photonic nanostructures within the photoresist nail polish, the programmable mask having a variable curvature; and
 an actuator configured to bend the programmable mask such that the variable curvature of the programmable mask approximates a curvature of the fingernail received within the opening of the housing and underneath the programmable mask.

12. The nail polish system of claim 11, wherein the programmable mask is a liquid crystal display (LCD) or a digital light processing screen (DLP).

13. The nail polish system of claim 11, further comprising:
a controller configured to control light transmission properties of the programmable mask.

14. The nail polish system of claim 11, further comprising a lens contained within the housing and configured to focus light onto the photoresist nail polish.

15. The nail polish system of claim 11, further comprising;
a controller; and
a distance detector configured to measure a distance between the programmable mask and the photoresist nail polish on the fingernail received within the opening of the housing, and to provide the distance to the controller,
wherein the controller causes the actuator to bend the programmable mask based upon the distance between the programmable mask and the photoresist nail polish.

16. The nail polish system of claim 11,
wherein the actuator is a first actuator,
the nail polish system further comprising a second actuator connected to a different side of the programmable mask from the first actuator, the second actuator being configured to bend the programmable mask along with the first actuator such that the variable radius approximates the curvature of the fingernail received within the opening of the housing and underneath the programmable mask.

* * * * *